(12) United States Patent
Gallina et al.

(10) Patent No.: US 7,471,518 B2
(45) Date of Patent: Dec. 30, 2008

(54) QUASI-RADIAL HEATSINK WITH RECTANGULAR FORM FACTOR AND UNIFORM FIN LENGTH

(75) Inventors: Mark J. Gallina, Hillsboro, OR (US); Kevin Ceurter, Bonney Lake, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/052,773

(22) Filed: Mar. 21, 2008

(65) Prior Publication Data

US 2008/0165498 A1   Jul. 10, 2008

Related U.S. Application Data

(63) Continuation of application No. 11/353,777, filed on Feb. 14, 2006, now abandoned.

(51) Int. Cl.
*H05K 7/20* (2006.01)
*F28F 7/00* (2006.01)

(52) U.S. Cl. .................... 361/719; 361/704; 361/709; 361/710; 165/80.3; 165/185; 174/16.3

(58) Field of Classification Search .......... 361/704, 361/709–710, 719; 165/80.3, 104.33, 185; 174/16.3
See application file for complete search history.

(56) References Cited

U.S. PATENT DOCUMENTS

| | | | | |
|---|---|---|---|---|
| 2,176,657 A | * | 10/1939 | Finch | 313/21 |
| 3,566,969 A | * | 3/1971 | Koltuniak et al. | 165/80.3 |
| 5,844,313 A | * | 12/1998 | Hoffmann | 257/722 |
| 6,094,346 A | * | 7/2000 | Schweers et al. | 361/695 |
| 6,308,771 B1 | * | 10/2001 | Tavassoli | 165/80.3 |
| 6,671,172 B2 | * | 12/2003 | Carter et al. | 361/697 |
| 6,691,768 B2 | | 2/2004 | Hsieh et al. | |
| 7,152,666 B2 | | 12/2006 | Chen et al. | |
| 2005/0088823 A1 | | 4/2005 | Kabadi et al. | |

FOREIGN PATENT DOCUMENTS

GB       2364179 A    1/2002

OTHER PUBLICATIONS

International Search Report and Written Opinion of the International Searching Authority; Dated Sep. 14, 2007; PCT/US2007/004143, 10 pgs.

* cited by examiner

*Primary Examiner*—Jayprakash N Gandhi
*Assistant Examiner*—Robert J Hoffberg
(74) *Attorney, Agent, or Firm*—Robert D. Anderson; Intel Corporation

(57) ABSTRACT

In some embodiments, a heatsink includes a thermally conductive core and at least ten thermally conductive fins extending quasi-radially from the thermally conductive core, wherein most of the fins are of uniform length, and wherein at least a portion of the thermally conductive core is shaped such that the fins having uniform length form a substantially rectangular cross sectional form factor. Other embodiments are disclosed and claimed.

14 Claims, 8 Drawing Sheets

QUASI-RADIAL HEATSINK WITH RECTANGULAR FORM FACTOR AND UNIFORM FIN LENGTH

The invention relates to thermal management devices. More particularly, some embodiments of the invention relate to a quasi-radial heatsink with a rectangular form factor and uniform fin length.

BACKGROUND AND RELATED ART

Many electronic devices require or benefit from the use of thermal management devices, such as heatsinks.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
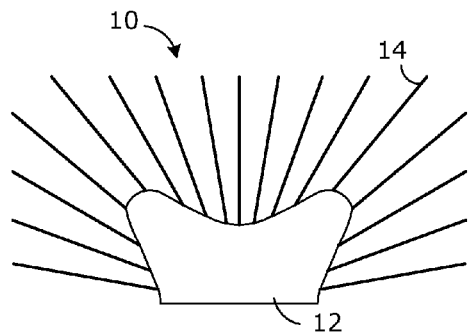
FIG. 1 is a schematic view of a heatsink, in accordance with some embodiments of the invention.
Figure 2:
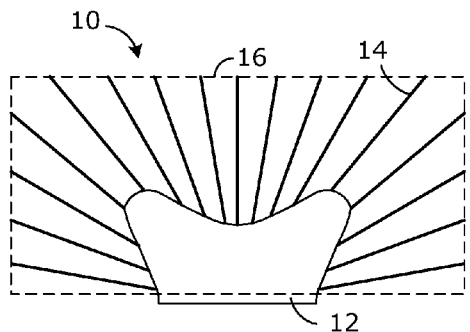
FIG. 2 is another schematic view of the heatsink from FIG. 1, in accordance with some embodiments of the invention.

With reference to FIGS. 1-2, a heatsink 10, in accordance with some embodiments of the invention, includes a thermally conductive core 12 and at least ten thermally conductive fins 14 extending quasi-radially from the thermally conductive core 12. In the example shown in FIGS. 1-2, the heatsink 10 includes seventeen fins 14 extending from the core 12. In accordance with some embodiments of the invention, most of the fins 14 may be of uniform length and at least a portion of the thermally conductive core 12 is shaped such that the fins 14 having uniform length form a substantially rectangular form factor.

For example, the dashed rectangular box 16 in FIG. 2 illustrates how the fins 14 form a substantially rectangular form factor. For example, a portion of the core 12 inside in the box 16 may be formed with a complex shape which positions the tips of the uniform length fins 14 along the perimeter of the box 16. The shape of the core 12 may bulge or recess in accordance with the angles of the fins 14 and their respective positions around the core 12. Advantageously, some embodiments of the invention may provide thermal gain by reducing conduction spreading resistance through the core 12 by having core material concentrated in a central portion of the heatsink 10.

As used herein, uniform may mean the same, substantially the same, or within reasonable variation (e.g. due to manufacturing precision, tolerances, etc.). As used herein, quasi-radial may mean precisely radial, substantially radial, or just having a general radial arrangement (e.g. a plurality of fins distributed around a core with varying angular orientations, even if the angles of the fins do not change regularly or the fins do not intersect a common point).

For example, in some embodiments, the fins having uniform length may also have uniform thickness profiles. The fins having uniform length and thickness profiles may also have uniform tip-to-tip spacing. In some embodiments, the fins having uniform length and thickness profiles may also have uniform cross-sectional area between the fins. The heatsink 10 may be made by any of a number of well known, conventional manufacturing techniques including, for example, machining, casting, molding, or extrusion. In some applications, it may be preferred that all of the fins are configured to be suitable for manufacturing by an extrusion process. For example, the thermally conductive core and the fins may be made from aluminum.

In some applications, the thermally conductive core may include a copper portion (e.g. a copper slug). For example, some embodiments may further include two fins on opposite sides of the thermally conductive core 12 which are longer than the other fins 14 and are adapted to be utilized as structural members to transfer a preload to a heat source. The two longer fins may also be thicker than the other fins 14. In some applications, all but a small subset of the fins may be of uniform length (e.g. generally six or fewer fins may be different lengths in order to accommodate the structural fins).

Figure 3:
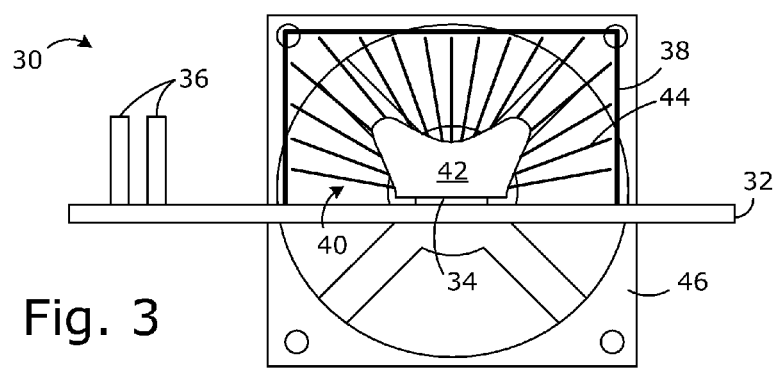
FIG. 3 is a schematic view of an electronic system, in accordance with some embodiments of the invention.
Figure 4:
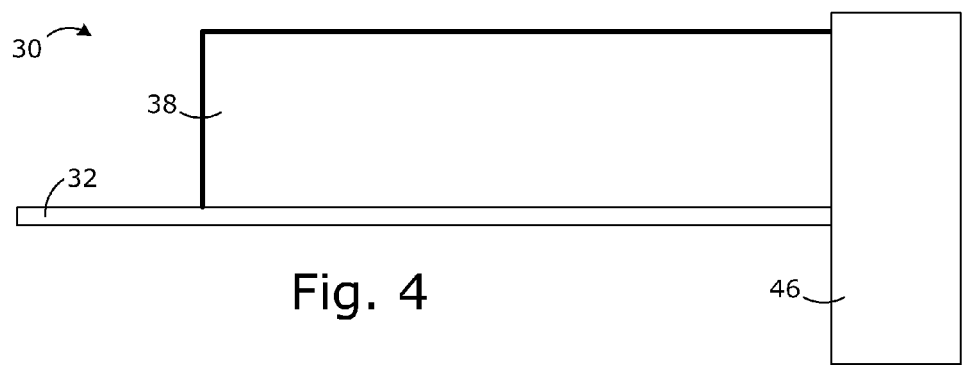
FIG. 4 is another schematic view of the electronic system from FIG. 3, in accordance with some embodiments of the invention.

With reference to FIGS. 3-4, an electronic system 30 includes a system board 32, an electronic component 34 on the system board, and a heatsink 36 thermally coupled to the electronic component 34. For example, the heatsink includes a thermally conductive core 42 and at least ten thermally conductive fins 44 extending quasi-radially from the thermally conductive core 42, wherein most of the fins 44 are of uniform length and wherein at least a portion of the thermally conductive core 42 is shaped such that the fins 44 having uniform length form a substantially rectangular form factor.

For example, the electronic component 34 may be a processor. For example, the system 30 may further include a double data rate memory module 36 coupled to the system board 32. For example, the system 30 may further include a rectangular form factor duct 38 positioned around the heatsink 40 and a fan 46 positioned to provide cooling air through the duct 38.

The heatsink 40 may include fins 44 having uniform length, uniform thickness profiles, and/or uniform tip-to-tip spacing or uniform cross-sectional area between the fins. The core 42 and fins 44 may be made from aluminum and may be configured to be suitable for manufacturing by an extrusion process. In some applications, the core 42 may include a copper slug. For example, the heatsink 40 may include two longer, thicker fins on opposite sides of the core 42 which are adapted to be utilized as structural members to transfer a preload to the electronic component 34.

An aluminum extrusion heat sink, having the complex shape in accordance with some embodiments of the present invention, may be particularly useful for space constrained systems consistent with small form factors. For example, some embodiments of the invention may find utility in a Balanced Technology Extended (BTX) desktop computer form factor. For example, some embodiments of the invention may provide a quasi-radial fin heat sink compliant with the form factor specifications for space constrained systems shaped to fit within a rectangular duct. The fins may be of uniform length, increasing or maximizing their surface area while maintaining a constant or substantially constant height/thickness ratio. Advantageously, the complex shape of the core, in accordance with some embodiments of the invention, may provide a large surface area to distribute the fins, allowing greater spacing between fins and/or a higher fin count. For low cost applications, the greater spacing between the fins may allow the complex shaped heat sink, in accordance with some embodiments of the invention, to be manufactured using an extrusion process.

Figure 5:
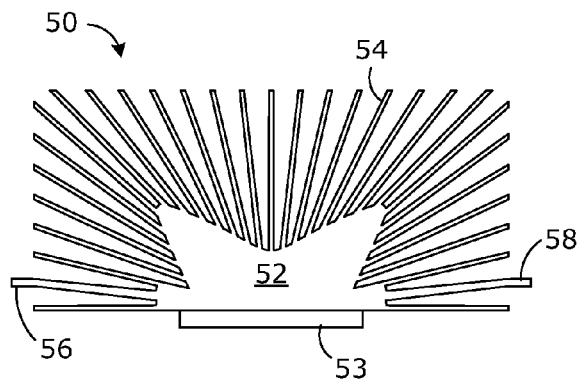
FIG. 5 is a front view of another heatsink, in accordance with some embodiments of the invention.
Figure 6:
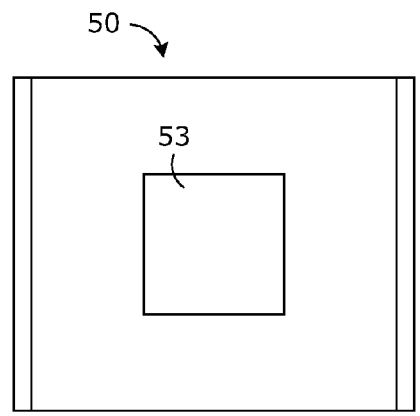
FIG. 6 is a bottom view of the heatsink from FIG. 5, in accordance with some embodiments of the invention.
Figure 7:
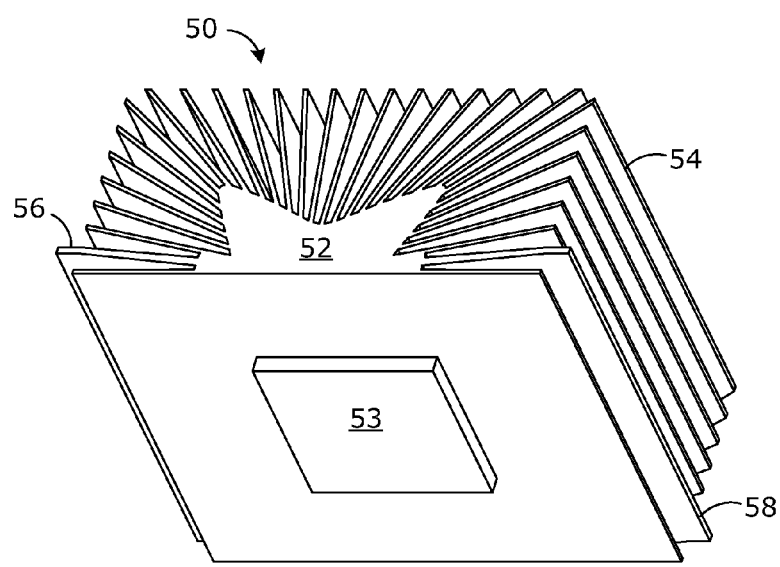
FIG. 7 is a bottom, perspective view of the heatsink from FIG. 5, in accordance with some embodiments of the invention.

With reference to FIGS. 5-7, a heatsink 50, in accordance with some embodiments of the invention, includes a thermally conductive core 52 and at least ten thermally conductive fins 54 extending quasi-radially from the thermally conductive core 52. In the example shown in FIGS. 5-7, the heatsink 50 includes thirty-one fins 54 extending from the core 52. In general, utilizing more fins provides larger surface area and may improve the performance of the heatsink for some applications. In accordance with some embodiments of the invention, most of the fins 54 may be of uniform length and at least a portion of the thermally conductive core 52 is shaped such that the fins 54 having uniform length form a substantially rectangular form factor.

For example, in some embodiments, the fins 54 having uniform length may also have uniform thickness profiles. The fins 54 having uniform length and thickness profiles may also have uniform tip-to-tip spacing. In some embodiments, the fins 54 having uniform length and thickness profiles may also have uniform cross-sectional area between the fins. In some applications, it may be preferred that all of the fins 54 are configured to be suitable for manufacturing by an extrusion process. For example, the thermally conductive core 52 and the fins 54 may be made from aluminum. The core 52 may include a pedestal or base portion 53, which may be integral with the core 52 (e.g. monolithic from an extrusion or molding process). Advantageously, the core 52 may provide a concentrated core area which may provide lower conduction resistance to heat conduction (e.g. compared to flat-plate based heat sinks).

As shown in FIG. 5, all but six of the fins 54 may be of uniform length (e.g. a small subset of fins may be different lengths in order to accommodate the structural fins). For example, some embodiments may further include two fins 56 and 58 on opposite sides of the thermally conductive core 52 which are longer than the other fins 54 and are adapted to be utilized as structural members to transfer a preload to a heat source. The two longer fins 56 and 58 may also be thicker than the other fins 54. Advantageously, the complex shape of the core 52 may allow a higher or maximum fin count while reducing or minimizing the conduction resistance in the core itself. In some applications, the core 52 may be contained within the shadow of the fan hub, presenting relatively more open area to the airflow field.

Figure 8:
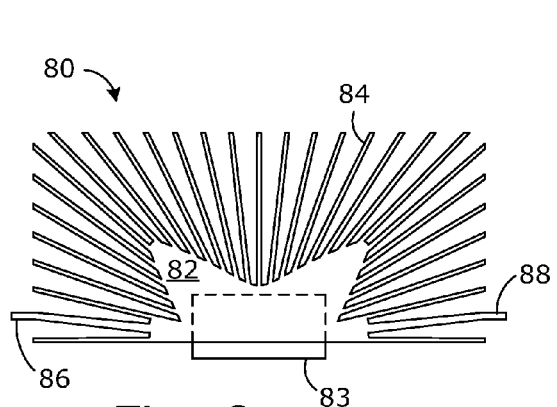
FIG. 8 is a front view of another heatsink, in accordance with some embodiments of the invention.
Figure 9:
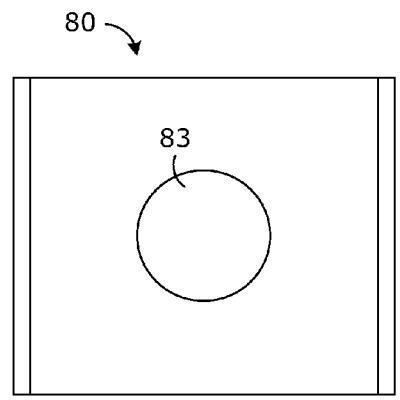
FIG. 9 is a bottom view of the heatsink from FIG. 9, in accordance with some embodiments of the invention.
Figure 10:
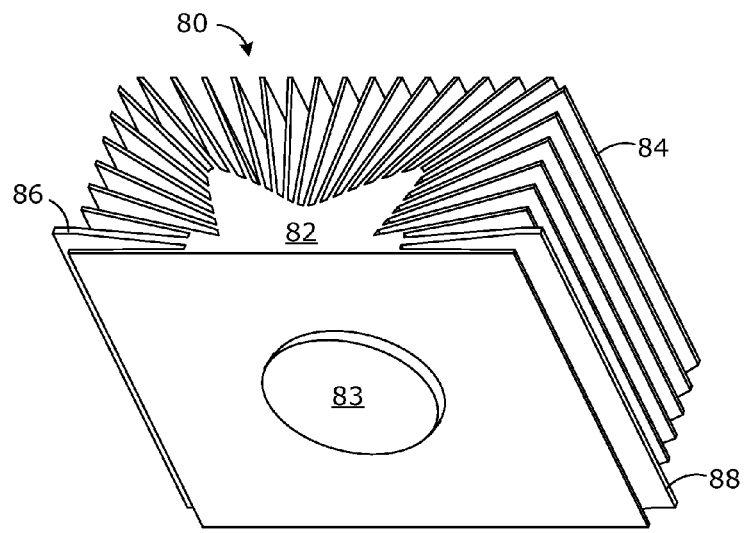
FIG. 10 is a bottom, perspective view of the heatsink from FIG. 8, in accordance with some embodiments of the invention.

With reference to FIGS. 8-10, a heatsink 80, in accordance with some embodiments of the invention, includes a thermally conductive core 82 and at least ten thermally conductive fins 84 extending quasi-radially from the thermally conductive core 82. In the example shown in FIGS. 5-7, the heatsink 80 includes thirty-one fins 84 extending from the core 82. In accordance with some embodiments of the invention, most of the fins 84 may be of uniform length and at least a portion of the thermally conductive core 82 is shaped such that the fins 84 having uniform length form a substantially rectangular form factor.

For example, in some embodiments, the fins 84 having uniform length may also have uniform thickness profiles. The fins 84 having uniform length and thickness profiles may also have uniform tip-to-tip spacing. In some embodiments, the fins 84 having uniform length and thickness profiles may also have uniform cross-sectional area between the fins. In some applications, it may be preferred that all of the fins 84 are configured to be suitable for manufacturing by an extrusion process. For example, the thermally conductive core 82 and the fins 84 may be made from aluminum.

For example, as shown in FIGS. 8-10, the thermally conductive core 82 includes a copper portion 83. For example, the copper portion 83 may be a right cylindrical copper slug. Some extrusion processes may be able to incorporate the copper portion 83. Alternatively, the core 82 and fins 84 may be extruded and thereafter drilled, milled, or machined to provide an opening in the core 82 for the copper portion 83. In some applications, the copper portion 83 may be secured in the opening by shrink fitting. Other conventional manufacturing techniques may be utilized to provide the core 82 with the copper portion 83. For some applications, copper may provide better thermal performance as compared to aluminum, although generally at a higher cost.

As shown in FIG. 8, all but six of the fins 84 may be of uniform length. For example, some embodiments may further include two fins 86 and 88 on opposite sides of the thermally conductive core 82 which are longer than the other fins 84 and are adapted to be utilized as structural members to transfer a preload to a heat source. The two longer fins 86 and 88 may also be thicker than the other fins 84.

With reference to FIGS. 11-14, a heatsink 110, in accordance with some embodiments of the invention, includes a thermally conductive core 112 and at least ten thermally conductive fins 114 extending quasi-radially from the thermally conductive core 112. In the example shown in FIGS. 11-14, the heatsink 110 includes thirty-one fins 114 extending from the core 112. In accordance with some embodiments of the invention, most of the fins 114 may be of uniform length and at least a portion of the thermally conductive core 112 is shaped such that the fins 114 having uniform length form a substantially rectangular form factor.

Figure 13:
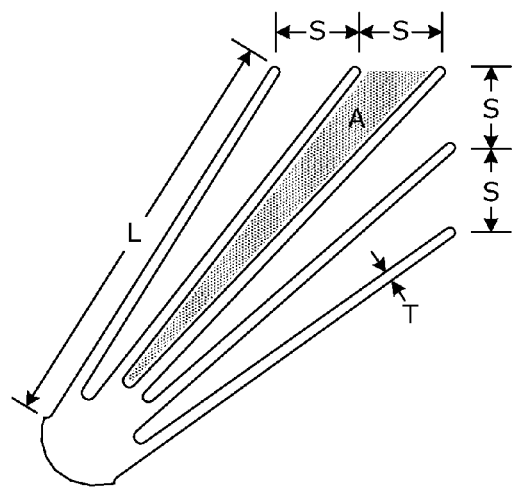
FIG. 13 is an enlarged, fragmented view of some fins from the heatsink from FIG. 11, in accordance with some embodiments of the invention.
Figure 14:
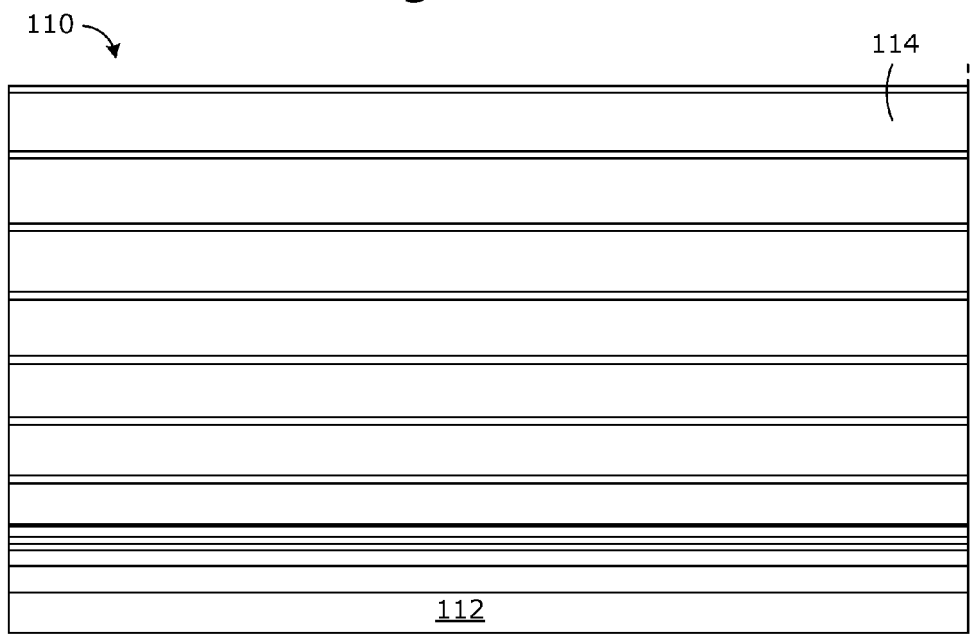
FIG. 14 is a side view of the heatsink from FIG. 11, in accordance with some embodiments of the invention.

With reference to FIG. 13, most of the fins 114 have uniform length (e.g. the length L is the same or about the same for those fins). In this example, the fins 114 having uniform length may also have uniform thickness profiles (e.g. those fins have about the same thickness profile T). Those skilled in the art will appreciate that the thickness T is not necessarily constant along the length of the fins and the fins 114 may have a slight taper. For example, the fins may be about 0.1 mm thinner at the tip than they are at the point they attach to the core 112. However, the thickness profile may be considered uniform among fins having substantially the same taper. In this example, the fins 114 having uniform length and thickness profiles may also have uniform tip-to-tip spacing (e.g. about the same distance S between tips of the fins).

In some examples, a uniform cross-sectional area gap A may be provided between the fins. For example, the spacing between fins at the attach point to the conductive core may be held constant, and the tip-to-tip spacing may be varied slightly until a uniform cross-sectional area is achieved. This configuration may results in a slight variation in tip-to-tip spacing (e.g. within about a 1 mm range, visually the tip-to-tip may still appear uniform). In some applications, the uniform cross-sectional area my have a slight performance advantage over the uniform tip-to-tip spacing.

In some applications, it may be preferred that all of the fins 114 are configured to be suitable for manufacturing by an extrusion process. For example, the thermally conductive core 112 and the fins 114 may be made from aluminum.

Figure 11:
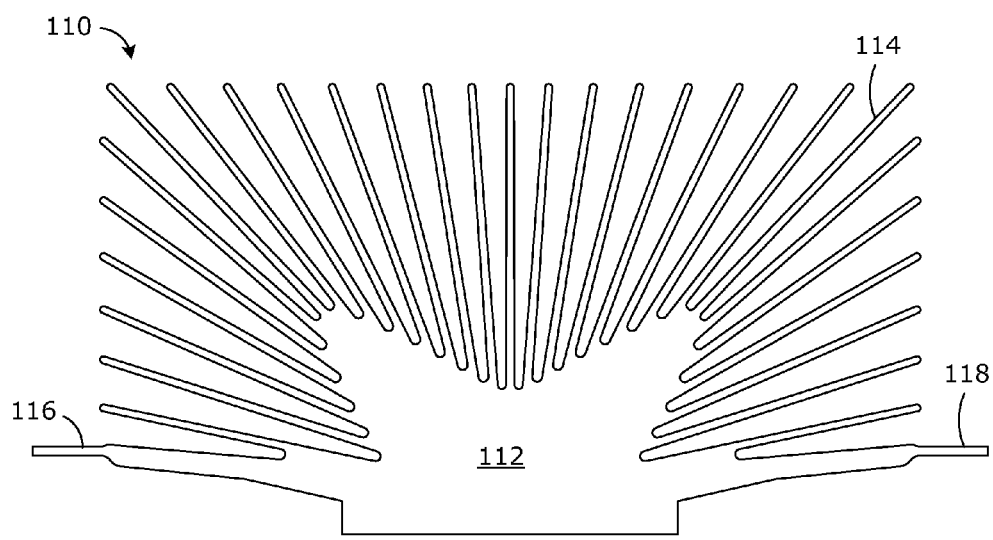
FIG. 11 is a front view of another heatsink, in accordance with some embodiments of the invention.
Figure 12:
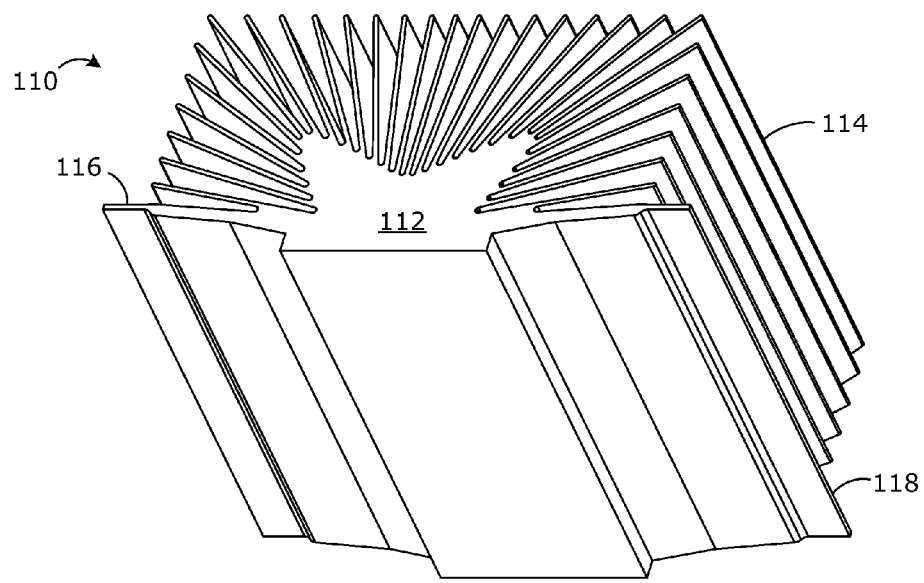
FIG. 12 is a bottom, perspective view of the heatsink from FIG. 11, in accordance with some embodiments of the invention.

As shown in FIG. 11, all but four of the fins 114 may be of uniform length (e.g. a small subset of fins may be different lengths in order to accommodate the structural fins). For example, some embodiments may further include two fins 116 and 118 on opposite sides of the thermally conductive core 112 which are longer than the other fins 114 and are adapted to be utilized as structural members to transfer a preload to a heat source. The two longer fins 116 and 118 may also be thicker than the other fins 114.

With reference to FIGS. 15-19, a heatsink 150, in accordance with some embodiments of the invention, includes a thermally conductive core 152 and at least ten thermally conductive fins 154 extending quasi-radially from the thermally conductive core 152. In the example shown in FIGS. 15-19, the heatsink 150 includes thirty-one fins 154 extending from the core 152. In accordance with some embodiments of the invention, most of the fins 154 may be of uniform length and at least a portion of the thermally conductive core 152 is shaped such that the fins 154 having uniform length form a substantially rectangular form factor.

Figure 15:
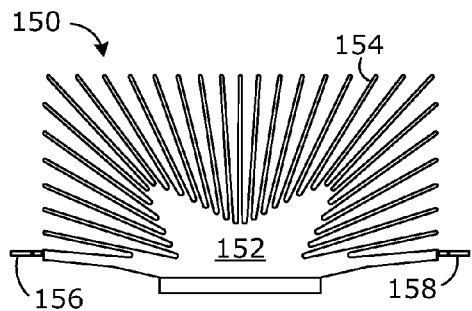
FIG. 15 is a front view of another heatsink, in accordance with some embodiments of the invention.
Figure 16:
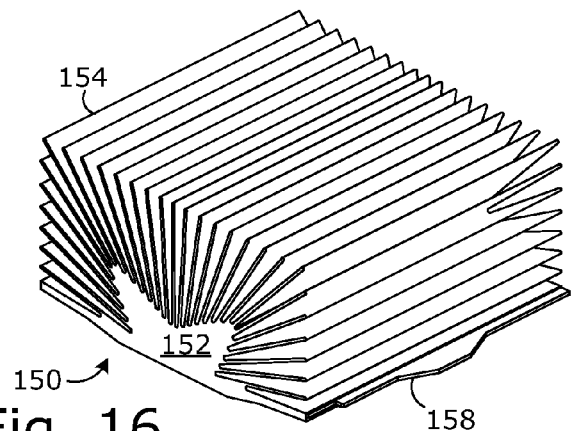
FIG. 16 is a top, perspective view of the heatsink from FIG. 15, in accordance with some embodiments of the invention.
Figure 17:
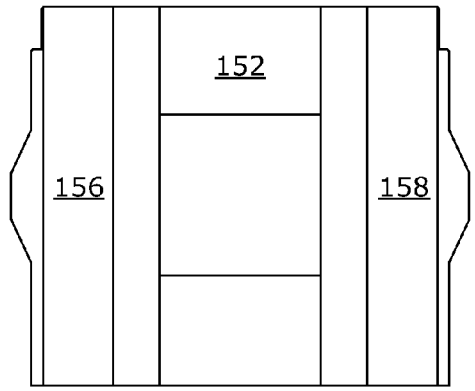
FIG. 17 is a bottom view of the heatsink from FIG. 15, in accordance with some embodiments of the invention.
Figure 18:
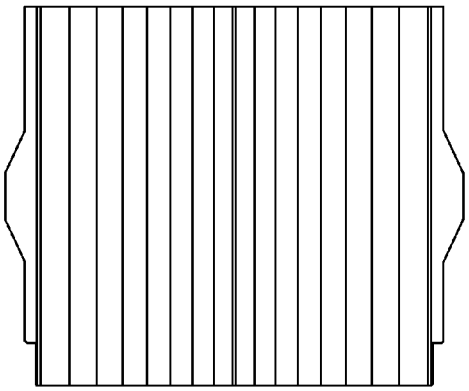
FIG. 18 is a top view of the heatsink from FIG. 15, in accordance with some embodiments of the invention.
Figure 19:
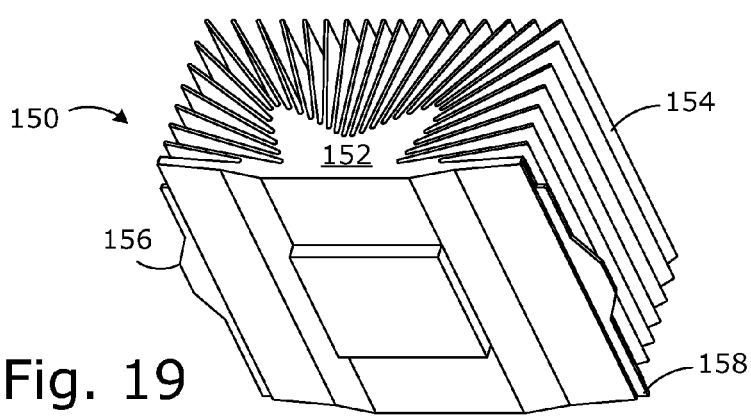
FIG. 19 is a bottom, perspective view of the heatsink from FIG. 15, in accordance with some embodiments of the invention.

With reference to FIG. 15, most of the fins 114 have uniform length. In this example, the fins 154 having uniform length may also have uniform thickness profiles. In this example, the fins 154 having uniform length and thickness profiles may also have uniform tip-to-tip spacing or uniform cross-sectional area between the fins. In some applications, it may be preferred that all of the fins 154 are configured to be suitable for manufacturing by an extrusion process. For example, the thermally conductive core 152 and the fins 154 may be made from aluminum.

As shown in FIG. 15, all but four of the fins 154 may be of uniform length. For example, some embodiments may further include two fins 156 and 158 on opposite sides of the thermally conductive core 152 which are longer than the other fins 154 and are adapted to be utilized as structural members to transfer a preload to a heat source. The two longer fins 156 and 158 may also be thicker than the other fins 154. Advantageously, some embodiments of the heatsink 150 may be used to provide low-cost thermally efficient heatsink in space constrained systems (e.g. as described in connection with FIGS. 21-22 below).

Advantageously, embodiments of the invention may provide one or more of the following design benefits. The complex core shape may create a larger surface area to attach the fins (e.g. as compared to a flat, circular, or elliptical shaped core), thus allowing more fins spaced further apart. The compact, concentrated core shape may provide lower conduction resistance to heat conduction (e.g. compared to flat-plate based heat sinks). The complex core shape together with uniform fin length may provide a rectangular profile heat sink, which may fully utilize the cooling solution volume available in some small form factor specifications.

Some embodiments of the invention may be configured to be compliant with extrusion manufacturability constraints, thus enabling a low cost manufacturing solution. In some applications, embodiments of the heatsink can be made entirely from aluminum, thus reducing or minimizing material cost and shipping weight In some applications, the core of the heatsink may be positioned almost entirely in the region of the system fan hub, thus reducing or minimizing airflow impedance. In some embodiments, two fins may be able to be used as structural members to transfer the required preload, sometimes with a slight thickness increase.

Figure 20:
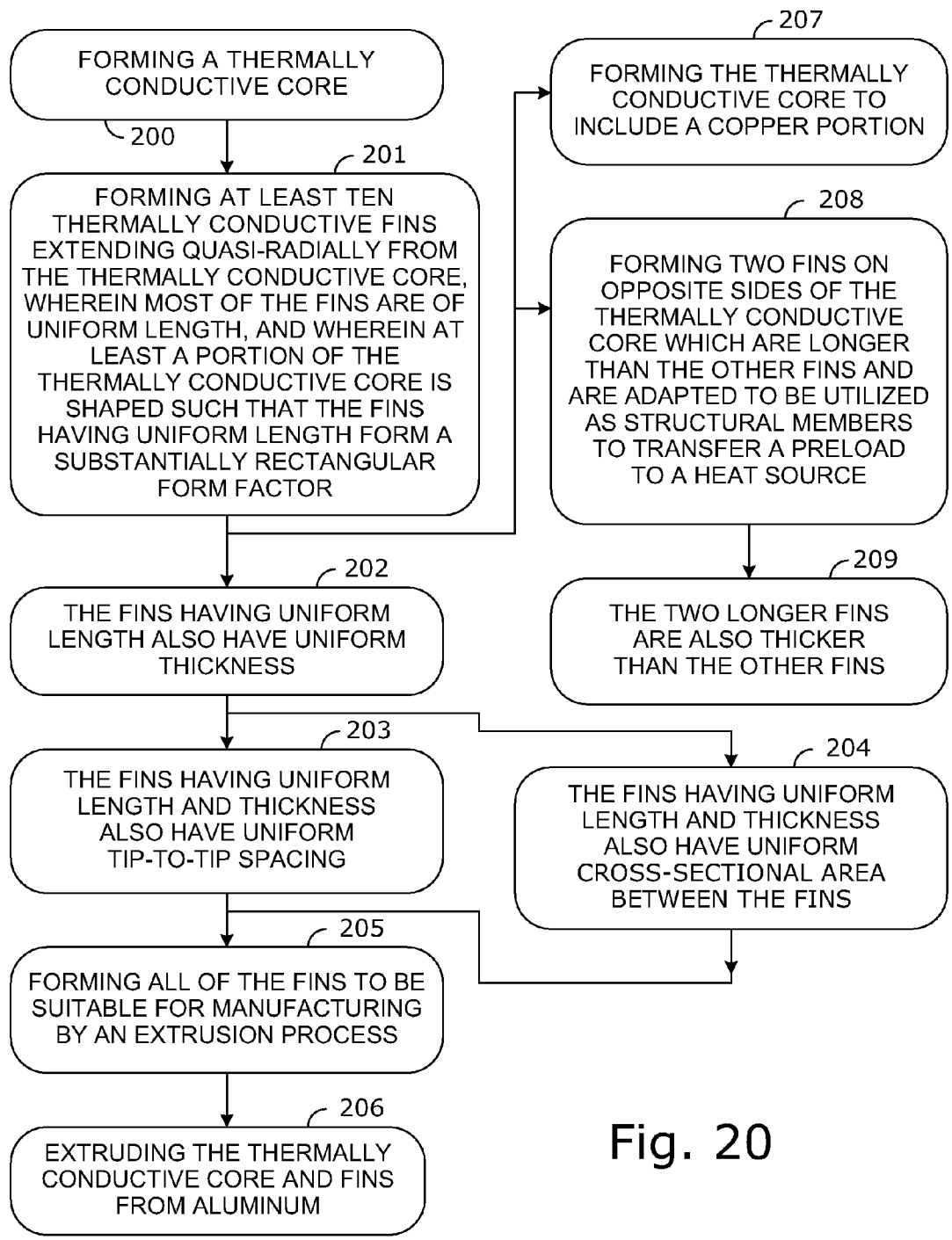
FIG. 20 is a flow diagram, in accordance with some embodiments of the invention.

With reference to FIG. 20, some embodiments of the invention involve forming a thermally conductive core (e.g. at block 200), and forming at least ten thermally conductive fins extending quasi-radially from the thermally conductive core, wherein most of the fins are of uniform length, and wherein at least a portion of the thermally conductive core is shaped such that the fins having uniform length form a substantially rectangular form factor (e.g. at block 201).

For example, the fins having uniform length may also have uniform thickness profiles (e.g. at block 202). For example, the fins having uniform length and thickness profiles may also have uniform tip-to-tip spacing (e.g. at block 203) or uniform cross-sectional area between the fins (e.g. at block 204). Some embodiments may further involve forming all of the fins to be suitable for manufacturing by an extrusion process (e.g. at block 205). Some embodiments may further involve extruding the thermally conductive core and fins from aluminum (e.g. at block 206).

Some embodiments of the invention may involve forming the thermally conductive core to include a copper portion (e.g. at block 207). In some applications, all but six or fewer of the fins may be the same length (e.g. a small subset of the fins may be different lengths to accommodate structural fins). Some embodiments may further involve forming two fins on opposite sides of the thermally conductive core which are longer than the other fins and are adapted to be utilized as structural members to transfer a preload to a heat source (e.g. at block 208). For example, the two longer fins may also be thicker than the other fins (e.g. at block 209).

Figure 22:
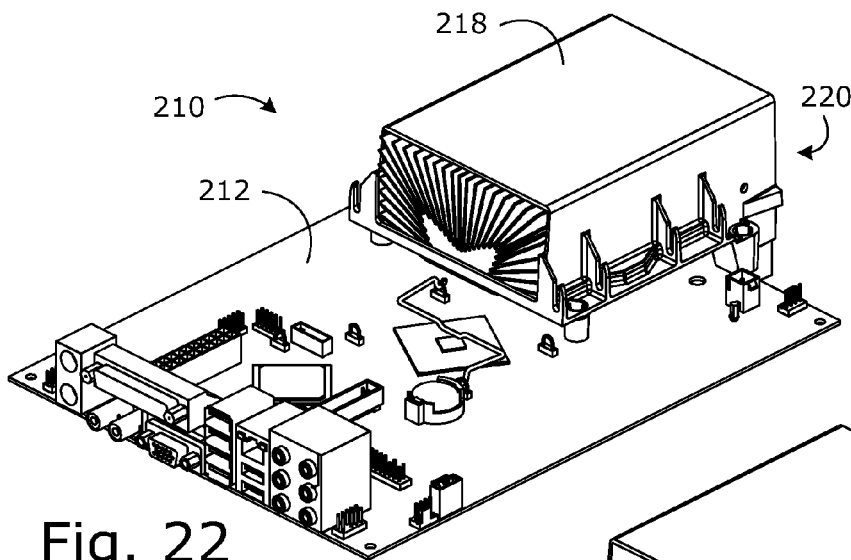
FIG. 22 is a perspective view of the assembled electronic system from FIG. 21, in accordance with some embodiments of the invention.
Figure 21:
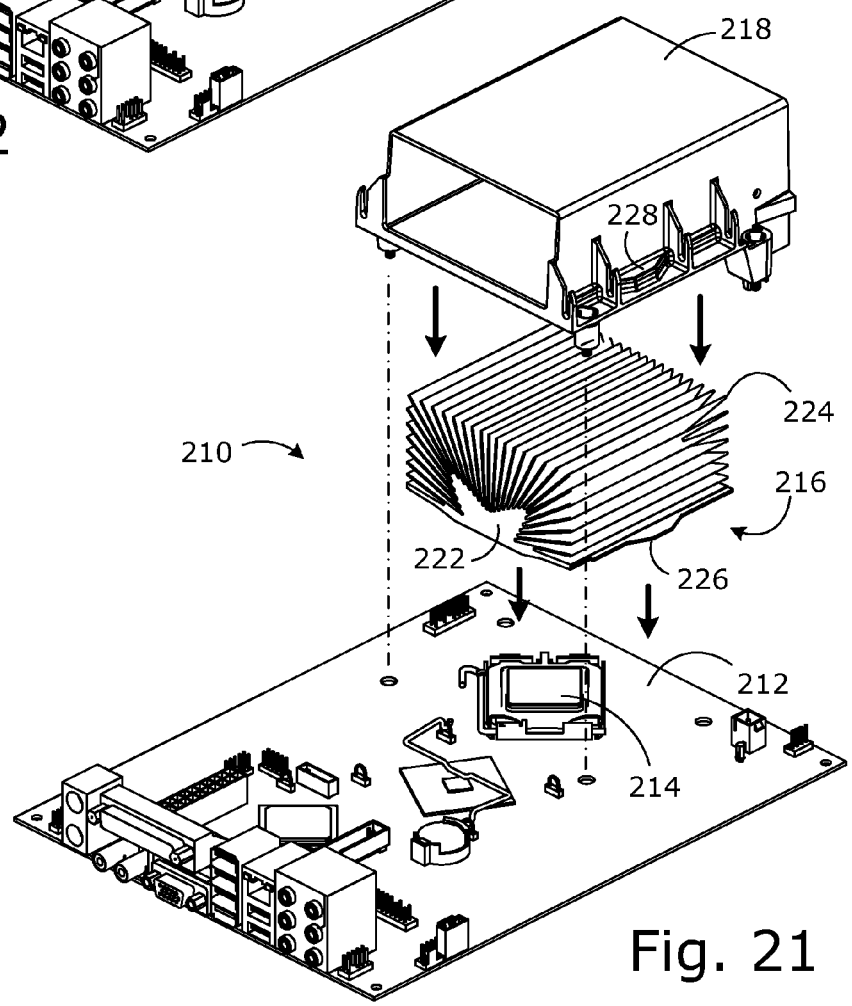
FIG. 21 is an exploded, perspective view of another electronic system, in accordance with some embodiments of the invention.

With reference to FIGS. 21-22, an electronic system 210 includes a system board 212, an electronic component 214 on the system board, and a heatsink 216 thermally coupled to the electronic component 214. For example, the heatsink 216 includes a thermally conductive core 222 and at least ten thermally conductive fins 224 extending quasi-radially from the thermally conductive core 222, wherein most of the fins 224 are of uniform length and wherein at least a portion of the thermally conductive core 222 is shaped such that the fins 224 having uniform length form a substantially rectangular form factor.

For example, the electronic component 214 may be a processor. For example, the system 210 may further include a double data rate memory, a chipset, a memory controller hub, an i/o controller, and/or other electronic components coupled to the system board 212. For example, the system 210 may further include a rectangular form factor duct 218 positioned around the heatsink 216 and a fan 220 positioned to provide cooling air through the duct 218.

The heatsink 216 may include fins 224 having uniform length, uniform thickness profiles, and/or uniform tip-to-tip spacing or uniform cross-sectional area between the fins. The core 222 and fins 224 may be made from aluminum and may be configured to be suitable for manufacturing by an extrusion process. In some applications, the core 222 may include a copper slug. For example, the heatsink 216 may include two longer, thicker fins 226 on opposite sides of the core 222 which are adapted to be utilized as structural members to transfer a preload to the electronic component 214. For example, the fins 226 may be received within recessed portions 228 of the duct 218 which may be utilized to apply downward pressure on the heatsink 216 when the duct 218 is secured to the system board 212.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A system, comprising:
a system board;
an electronic component on the system board; and
a heatsink thermally coupled to the electronic component, the heatsink comprising:
a thermally conductive core; and
at least ten thermally conductive fins extending quasi-radially from the thermally conductive core, wherein most of the fins are of uniform length,
wherein at least a portion of the thermally conductive core is shaped such that the fins having uniform length form a substantially rectangular form factor,
and wherein at least some of the fins extend directly from the thermally conductive core in an upward direction away from the electronic component.

2. The system of claim 1, wherein the fins having uniform length also have uniform thickness profiles.

3. The system of claim 2, wherein the fins having uniform length and thickness profiles also have uniform tip-to-tip spacing.

4. The system of claim 2, wherein the fins having uniform length and thickness profiles also have uniform cross-sectional area between the fins.

5. The system of claim 4, wherein all of the fins are configured to be suitable for manufacturing by an extrusion process.

6. The system of claim 5, wherein the thermally conductive core and the fins are aluminum.

7. The system of claim 1, wherein the thermally conductive core includes a copper portion.

8. The system of claim 1, further comprising:
two fins on opposite sides of the thermally conductive core which are longer than the other fins and are adapted to be utilized as structural members to transfer a preload to the electronic component.

9. The system of claim 8, wherein the two longer fins are also thicker than the other fins.

10. The system of claim 1, wherein the electronic component comprises a processor.

11. The system of claim 10, further comprising:
a double data rate memory coupled to the system board.

12. The system of claim 1, further comprising:
a rectangular form factor duct positioned around the heatsink; and
a fan positioned to provide cooling air through the duct.

13. The system of claim 1, wherein at least some of the fins extend directly from the thermally conductive core in a sideways direction.

14. The system of claim 1, wherein the fins are substantially straight.

* * * * *